(12) United States Patent
Gentry et al.

(10) Patent No.: US 6,857,113 B2
(45) Date of Patent: Feb. 15, 2005

(54) PROCESS AND SYSTEM FOR IDENTIFYING WIRES AT RISK OF ELECTROMIGRATION

(75) Inventors: Jason T Gentry, Wellington, CO (US); David D. Balhiser, Fort Collins, CO (US); Ronald G Harber, Loveland, CO (US); Bryan Haskin, Ft. Collins, CO (US); Gayvin E Stong, Fort Collins, CO (US); Paul J. Marcoux, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 132 days.

(21) Appl. No.: 10/241,623

(22) Filed: Sep. 11, 2002

(65) Prior Publication Data

US 2004/0049750 A1 Mar. 11, 2004

(51) Int. Cl.[7] .................... G06F 17/50; G06F 19/00; G06F 17/11
(52) U.S. Cl. ...................... 716/5; 716/703; 716/15
(58) Field of Search .................. 716/5; 703/15

(56) References Cited

U.S. PATENT DOCUMENTS

| | | | | |
|---|---|---|---|---|
| 5,404,310 A | * | 4/1995 | Mitsuhashi | 716/13 |
| 5,581,475 A | * | 12/1996 | Majors | 716/10 |
| 5,648,910 A | * | 7/1997 | Ito | 716/2 |
| 5,737,580 A | * | 4/1998 | Hathaway et al. | 716/12 |
| 5,943,487 A | * | 8/1999 | Messerman et al. | 716/11 |
| 6,038,383 A | * | 3/2000 | Young et al. | 716/5 |
| 6,072,945 A | * | 6/2000 | Aji et al. | 716/5 |
| 6,202,191 B1 | * | 3/2001 | Filippi et al. | 716/5 |
| 6,308,302 B1 | * | 10/2001 | Hathaway et al. | 716/5 |
| 6,308,310 B1 | * | 10/2001 | Nakamura | 716/14 |
| 6,311,315 B1 | * | 10/2001 | Tamaki | 716/7 |
| 6,349,401 B2 | * | 2/2002 | Tamaki | 716/2 |
| 6,405,346 B1 | * | 6/2002 | Nawa | 716/2 |
| 6,470,479 B1 | * | 10/2002 | Yamamoto | 716/4 |
| 6,532,570 B1 | * | 3/2003 | Mau | 716/2 |
| 6,543,041 B1 | * | 4/2003 | Scheffer et al. | 716/10 |
| 6,578,178 B2 | * | 6/2003 | Mau | 716/2 |
| 6,594,813 B1 | * | 7/2003 | Gandhi et al. | 716/17 |
| 6,725,433 B1 | * | 4/2004 | Hau-Riege et al. | 716/4 |
| 2001/0015464 A1 | * | 8/2001 | Tamaki | 257/393 |
| 2002/0013931 A1 | * | 1/2002 | Cano et al. | 716/1 |
| 2002/0199160 A1 | * | 12/2002 | Fujine | 716/5 |
| 2003/0066036 A1 | * | 4/2003 | Mau | 716/2 |

OTHER PUBLICATIONS

Banerjee et al., "Characterization of contract and via failure under short duration high pulsed current stress", 35th Annual IEEE International Proceedings of Reliability Physics Symposium, Apr. 8, 1997, pp. 216–220.*

(List continued on next page.)

*Primary Examiner*—Matthew Smith
*Assistant Examiner*—Phallaka Kik
(74) *Attorney, Agent, or Firm*—June L. Bouscaren

(57) ABSTRACT

A method and system of identifying one or more nets in a digital IC design that are at risk of electromigration comprises selecting a manufacturing process for the digital IC design and obtaining a clock period and process voltage. A voltage waveform transition time and effective capacitance is calculated for one or more of the nets. A maximum allowable effective capacitance for each one of the nets is calculated based upon a peak current analysis or an RMS current analysis. The effective capacitance for each net is compared against the maximum allowable capacitance to identify those nets that are at risk of failure due to the effects of electromigration.

26 Claims, 7 Drawing Sheets

OTHER PUBLICATIONS

Boon–Khin Liew, Peng Fang, Nathan CHeung, Chenming Hu, "Circuit Reliability Simulator for Interconnect, Via, and Contact Electromigration", IEEE Transactions on Electron Devices, vol. 39, No. 11, Nov. 1992, pp. 2472–2479.

Boon Khien Liew, Nathan Cheung, Chenming Hu, "Projecting Interconnect Electromigration Lifetime for Arbitraty CUrrent Waveforms", IEEE Transactions on Electron DEvices, vol. 37, No. 5, May 1990, pp. 1343–1351.

B.K.Liew, P Fang, N W Cheung, C Hu, "Reliability Simulator for Interconnect and Itnermetallic Contact Electromigration", IEEE/IRPS 1990, pp. 111–118.

B K Liew, N W Cheung, C Hu, "Electromigration Interconnect Lifetime Under AC and Pulse Stress", IEEE/IRPS 1989, pp. 215–219.

B K Liew, N W Cheung, and C Hu, "Effects of High Current Pulses on Integrated Circuit Metallization Reliability", IEEE 1988, pp. 3–6.

James W. Harrison, Jr., "Effect of Form Factor on Heating of M tal Lines by Pulsed Currents", private communication circa. 1995, pp. 1–24.

* cited by examiner

PROCESS AND SYSTEM FOR IDENTIFYING WIRES AT RISK OF ELECTROMIGRATION

BACKGROUND

Electromigration is a known phenomenon resulting in the physical transport of atoms in a metal wire along the direction of electron flow. It is generally accepted that as electrons are conducted through the metal wire, they interact with imperfections in the molecular lattice of the metal and scatter. The scattering of the electrons causes thermal heating. Scattering and heating cause the atoms to vibrate. The vibration of the atoms creates additional electron scattering. The scattering results in momentum transfer from the electrons to the ions that make up the lattice of the metal wire material. The scattering and thermal heating increases with an increase in the current density passing through the metal wire. If the metal wire cannot properly dissipate the heat generated as a result of electron flow, the physical transport of atoms increases and the net motion of the atoms can cause failures in the metal wire through voiding or hillocking.

Voiding produces an open circuit in the metal wire. The electron density at the void increases because the electrons that comprise the current flow pass through a smaller cross section. The electron density increase further accelerates thermal heating and the voiding phenomenon until the metal wire can no longer conduct current. Hillocking is the opposite of voiding and refers to the phenomenon where excess metal is deposited in one area of the metal wire creating a spur. If the spur gets large, it can create a short circuit between the metal wire having the spur and its neighboring metal wire.

Due to continual miniaturization of VLSI circuits, the metal wires that are the electrical interconnects of an IC, are subject to increasingly higher current densities. These current densities approach and exceed the level that can cause electromigration. It is important, therefore, to design a circuit where all of the constituent metal interconnects carry a current density that is lower than the current density that causes electromigration.

Under the prior art, electromigration risk was managed by estimating direct current electromigration risk. Specifically, the maximum load capacitance per width of metal wire interconnect was used as the limit under which all metal wire interconnects in an IC were designed. The load capacitance for each metal wire interconnect in the IC design was estimated and kept under the calculated maximum. It is known that there are two types of electromigration phenomenon, direct current electromigration and alternating current electromigration. For formerly prevalent clock frequencies and wire widths, the direct current electromigration effects are a limiting factor and load capacitance is a reliable predictor of electromigration risk in an IC. As clock speeds increase and wire widths decrease, however, alternating current electromigration effects present a significant risk of electromigration. The alternating current electromigration risk cannot be reliably managed using the direct current electromigration risk estimates and approaches.

Accordingly, there is a need for a more accurate and reliable predictor of electromigration risk for high speed digital ICs when alternating current electromigration presents a higher risk to IC reliability.

SUMMARY

A method of identifying one or more nets in a digital IC design that are at risk of electromigration comprises the steps of selecting a manufacturing process and obtaining a clock period and process voltage for the digital IC design. A voltage waveform transition time for one or more nets of the IC design is then obtained to assist in the calculation of a maximum allowable effective capacitance for each one of the nets as a function of a maximum allowable root mean square alternating current density, a maximum allowable alternating current density through a via, a minimum width of said wire, and minimum number of parallel vias per metal line. An effective capacitance for each one of the nets is calculated and is then compared against the maximum effective capacitance for each net to identify those nets at risk of failure due to the effects of electromigration.

According to another embodiment of the teachings of the present invention, a system for identifying one or more nets of a digital IC design that are at risk of electromigration comprises means for obtaining a clock period, process voltage, and waveform transition time for the IC design. The system further comprises means for calculating a maximum effective capacitance for each one of the nets. The maximum allowable effective capacitance is a function of a maximum allowable root mean square alternating current density, a maximum allowable alternating current density through a via, a minimum width of a wire that comprises the net, and a minimum number of parallel vias per net. The system also comprises means for calculating an effective capacitance for each one of the nets and means for comparing the maximum allowable effective capacitance against the effective capacitance for each net.

Advantageously, a method and system as disclosed herein enables efficient identification of nets that are at risk of failure due to the effects of electromigration permitting targeted assessment and redesign of the identified nets.

DETAILED DESCRIPTION

Alternating current electromigration effects are more likely to cause voiding and hillocking at high clock speeds than direct current electromigration effects. At high clock speeds, the current density on a metal wire is greatest during signal transition. In the time remaining in the clock cycle after signal transition, the wire is able to dissipate all or a portion of the heat generated during the transition. At higher clock speeds, there is less time for heat dissipation than at lower clock speeds. Accordingly, there is both a current density and a time component to a method for predicting electromigration risk on a wire.

Figure 1:
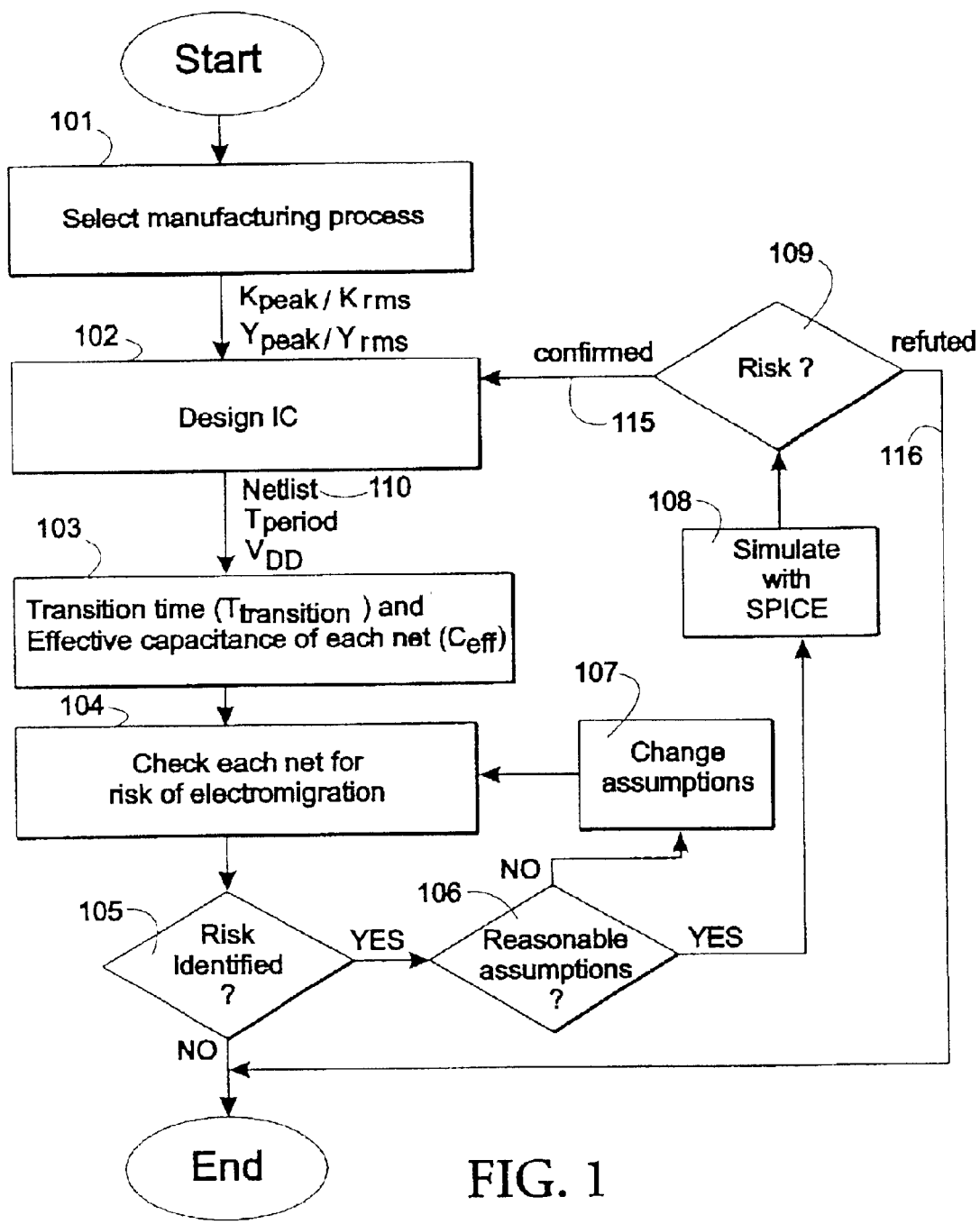
FIGS. 1 through 3 is a flow chart of an embodiment of a method according to the teachings of the present invention.
Figure 2:
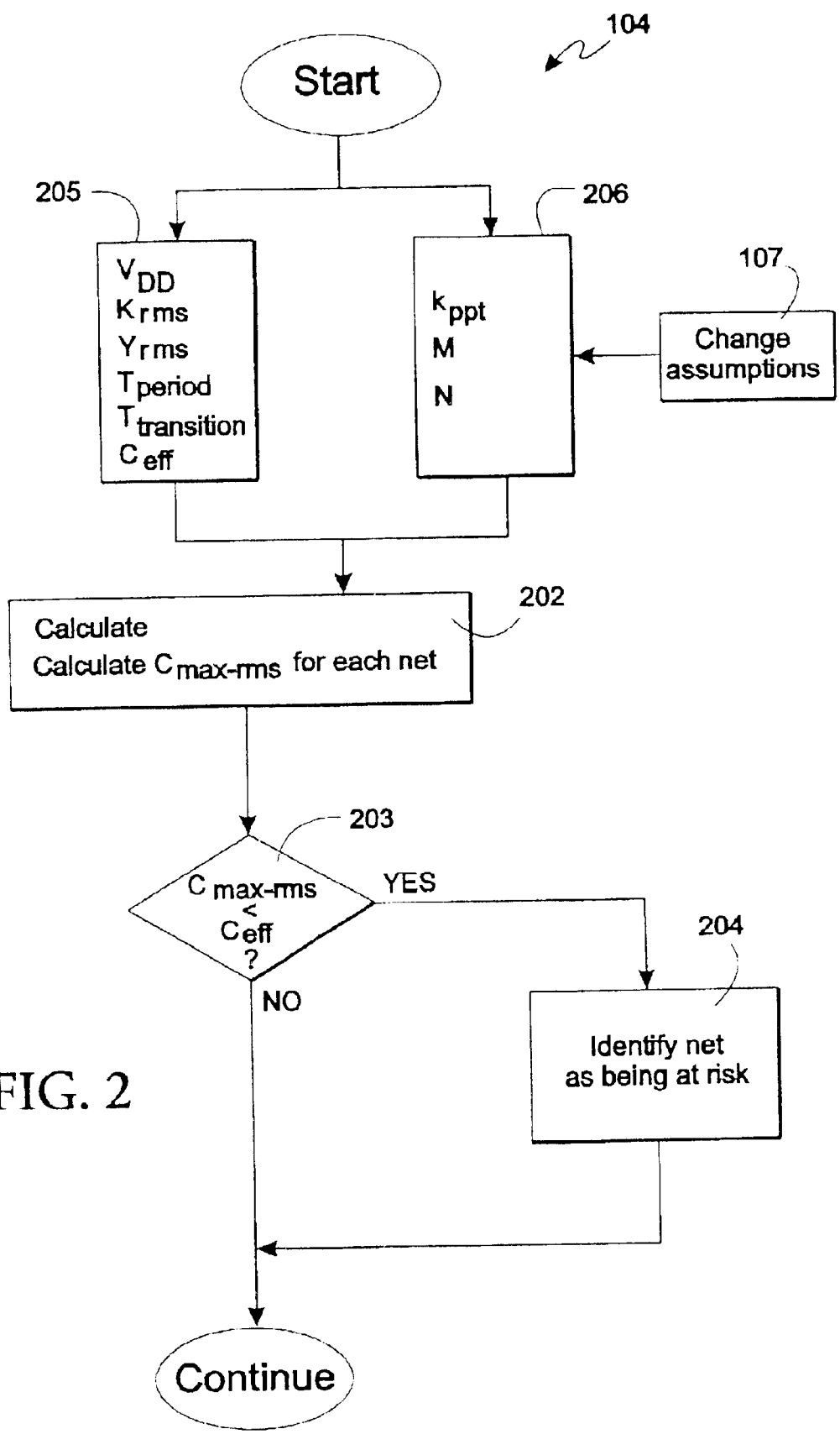
Figure 3:
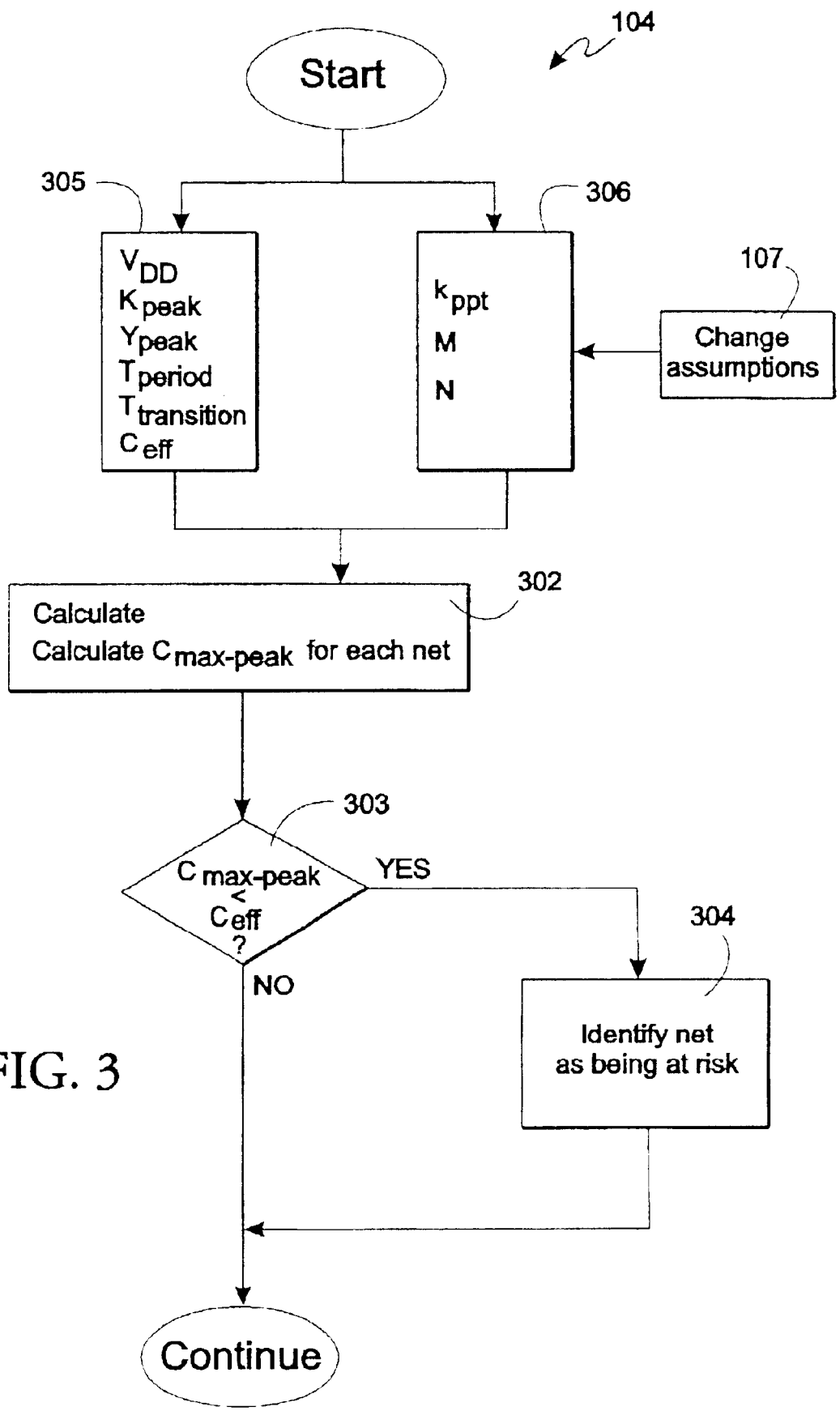

With specific reference to FIGS. 1–3 of the drawings, there is shown flow charts of embodiments of a method for assessing electromigration risk in a digital IC design.

Figure 9:
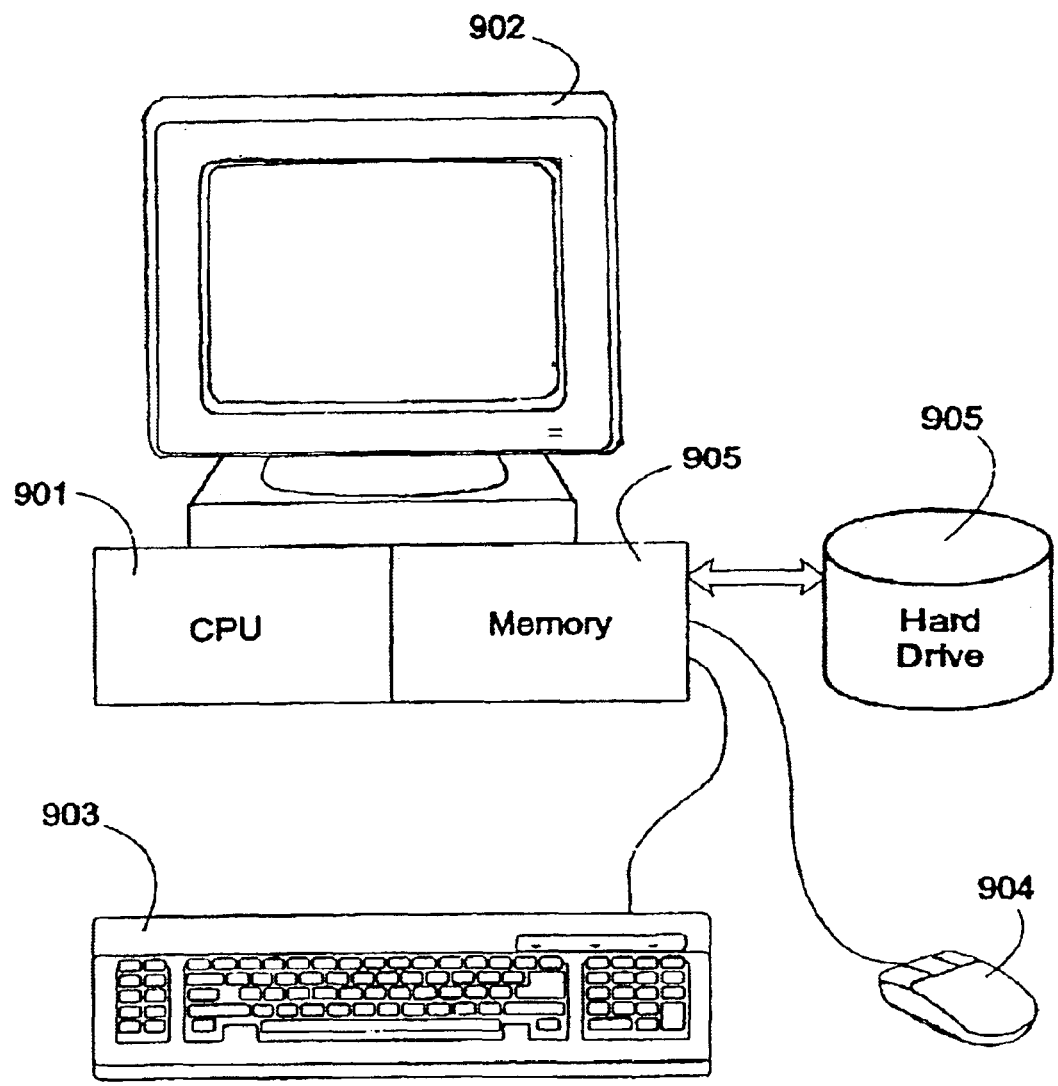
FIG. 9 is an illustration of an embodiment of a system according to the teachings of the present invention.

Advantageously, the assessment presented herein may be performed before the digital IC design is manufactured into an IC thereby obviating the expensive step of building and testing a part that cannot be profitably put into production. The method disclosed herein lends itself well to implementation on a system illustrated in FIG. 9 of the drawings that comprises a processor 901, graphical display device 902, human interface devices, such as a keyboard 903 and a mouse 904 and sufficient memory 905 to store, perform, and display the disclosed calculations. A workstation with a UNIX operating system is one processing system that is suitable for implementation of the method disclosed herein. Advantageously, there are many computer aided IC design software tools that are available on UNIX based systems and an IC designer may implement the present teachings on the same processing system as is used for IC design.

Figure 4:
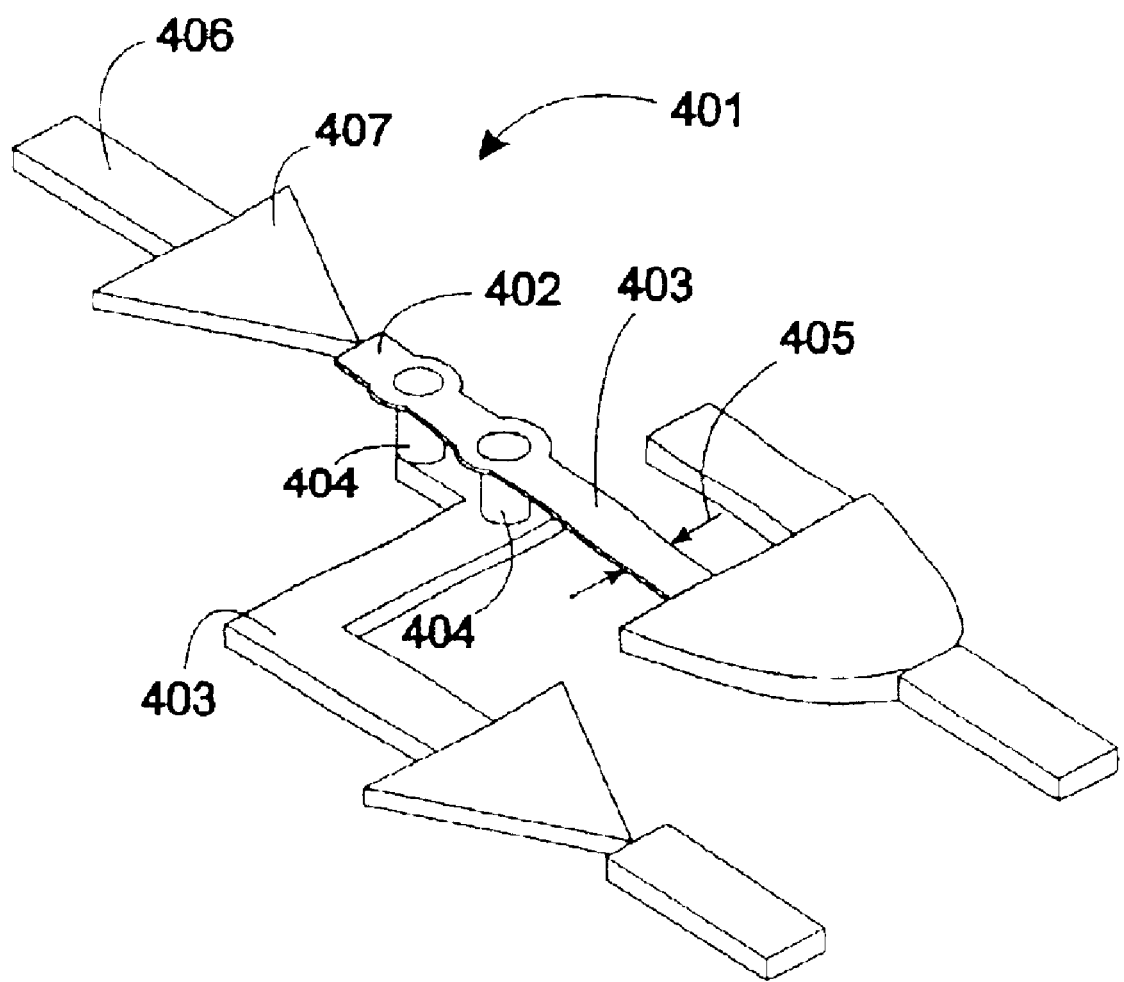
FIG. 4 is an illustrative diagram of a net disposed on two layers of an IC.

The first step in the assessment of electromigration risk is selection of a manufacturing process 101 and creation 102 of a digital IC design. One of the results of a digital IC design is a netlist 110. With specific reference to FIG. 4 of the drawings, the netlist 110 comprises information relating to a plurality of nets 401, each net 401 having a single driving pin 402. FIG. 4 of the drawings is merely illustrative of an example net. As one of ordinary skill in the art appreciates, there are an infinite variety of possible nets in the netlist 110 of an IC. FIG. 4 is included for purposes of establishing nomenclature for the net 401 and its constituent parts. For purposes of clarity, FIG. 4 is simpler than most nets found in an actual netlist 110. A voltage waveform is presented to the net 401 at the input 406 of the driving gate 407. The single driving pin 402 comprises the current response and therefore the current source for the rest of the net 401 being assessed. The net 401 is comprised of one or more wires or metal lines 403 electrically interconnected and commonly, but not necessarily, having one or more parallel vias 404. The net 401 is disposed on one or more layers of the IC. FIG. 4 of the drawings shows the net 401 comprising metal wires 403 disposed on two separate conducting IC layers, the metal wires 403 on the two layers being interconnected by two parallel vias 404. Not shown is an insulating layer separating the two conducting layers and through which the vias 404 pass.

When the IC designer selects 101 the manufacturing process with which the IC design is to be implemented, it establishes a value for process voltage, $V_{DD}$, current density constants, $K_{peak}$ or $K_{RMS}$ for a metal wire 403, and current density constants $Y_{peak}$ or $Y_{RMS}$ for a via 404. The current density constants establish the maximum allowable peak or RMS current densities through a wire 403 as a function of wire width or a single via 404.

Figure 5:
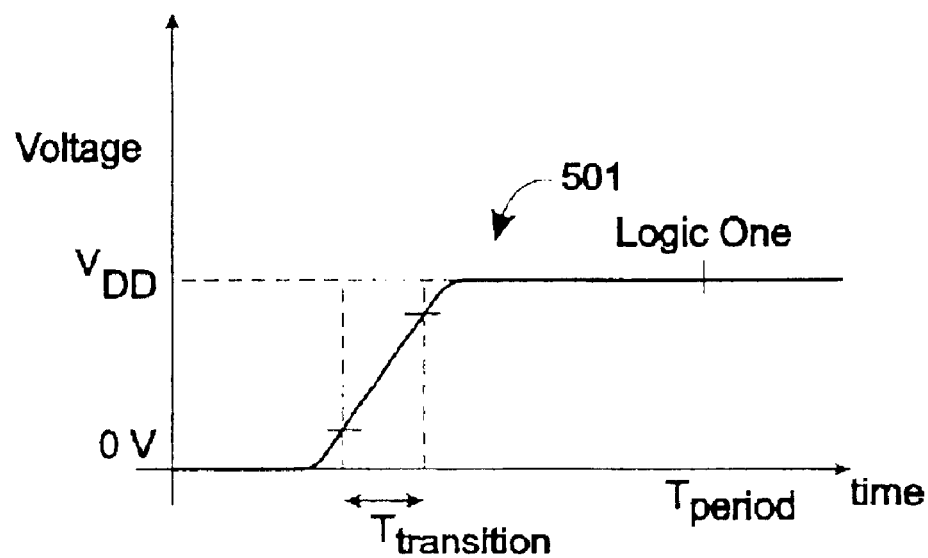
FIG. 5 is a diagram of a hypothetical voltage step.

When the IC design and manufacturing process is established, a timing simulator tool calculates 103 static timing analysis information for each driving pin 402 in the netlist 110. An appropriate timing simulator tool is Prime-Time™ software from Synopsys. It is a UNIX based software package that runs on a workstation computer and is suitable for the required calculations. Alternatively, other timing simulator tools or calculations may be used without departing from the scope of the present invention. The timing simulator calculates a voltage waveform transition time, $T_{transition}$, and an effective capacitance, $C_{eff}$, for each net 401 in the netlist 110. The voltage waveform transition time, $T_{transition}$, is a function of the rise and fall times of the voltage waveform that stimulates the net being assessed. An example of a voltage waveform 501 is shown in FIG. 5 of the drawings. In a specific embodiment, the rise and fall times of the voltage waveform 501 are calculated based upon the range of 50% to 70% of the voltage transition for each driving pin 402 in the netlist 110. Other ranges, such as 0% to 100% or 30% to 70%, are also valid depending upon the behavior of the IC design and the range that reflects the most accurate delay measurements. The overall transition time ($T_{transition}$) is approximated for purposes of the assessment to be a function of the rise and fall times over two periods of the voltage stimulus waveform and is calculated as:

$$T_{transition} = \frac{2T_{rise}T_{fall}}{(T_{rise} + T_{fall})}$$

The clock period ($T_{period}$) and the process voltage ($V_{DD}$) are known from the IC design information. The timing simulator tool then calculates an effective capacitance ($C_{eff}$) for each net 401. The timing calculations are based upon an assumption that there is a single voltage transition from low to high, for example 0 volts to $V_{DD}$, over a single clock period ($T_{period}$). The method then assesses 104 each net for risk of electromigration. The assessment step 104 has a variety of embodiments. Each embodiment for assessing electromigration risk may be used either alone or in conjunction with other embodiments as informed by the judgment of the IC designer or design team.

Figure 6:
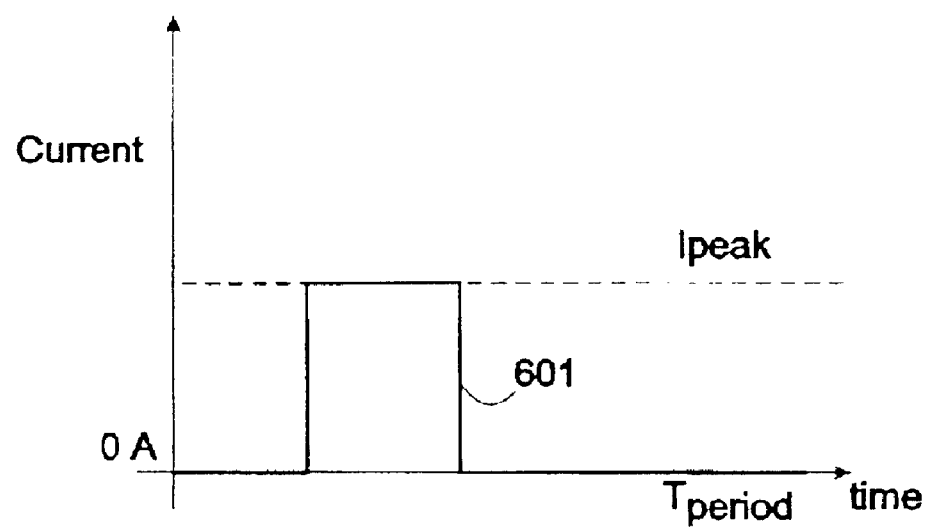
FIGS. 6 through 8 are diagrams of hypothetical current responses to the idealized voltage transition shown in FIG. 5.
Figure 7:
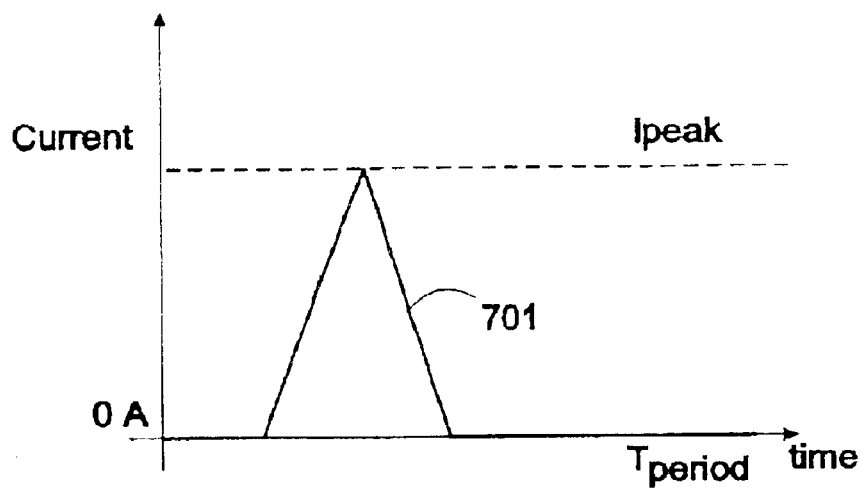
Figure 8:
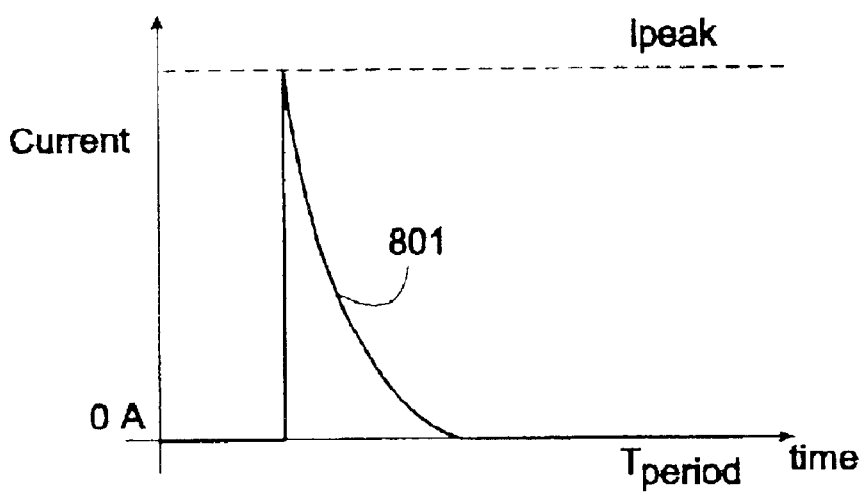

With specific reference to FIG. 5 of the drawings, there is shown a graphical representation of the single voltage transition 501 from 0 volts to $V_{DD}$. The corresponding current transition of the single clock period can be approximated as either a step waveform 601 as shown in FIG. 6, a triangle waveform 701 as shown in FIG. 7, or a decaying exponential waveform 801 as shown in FIG. 8. Each net 401 in the netlist 110 may respond differently to the voltage transition 501 depending upon the type of circuit that the net connects. With respect to current density, however, it can be shown that the decaying exponential current waveform response 801 is the most prone to risk of electromigration as compared to the step current waveform response 601 and the triangle current waveform response 701 as shown in FIGS. 6, 7, and 8. Comparatively, the step waveform 601 shows the least risk and the triangle waveform 701 presents a risk somewhere between the two others. For purposes of identifying potential areas of electromigration risk, therefore, decaying exponential current waveform response 801 renders the most pessimistic results. In some cases, this cautious assessment is warranted by the IC design, but in other cases, the result is overly pessimistic. Accordingly, it is often prudent for an IC designer to use the triangle waveform current response 701 when performing the electromigration risk assessment. Because the step waveform current response 601 never presents more of a risk of electromigration than either the triangle or the decaying exponential waveforms current response, and in some cases is overly optimistic and does not always identify nets that are at risk of failure due to electromigration effects, the step waveform current response is not developed herein or used in the method presented.

A variable T represents a time constant resulting from the resistive and capacitive loads on a line that cause the voltage waveform to depart from the ideal step response. The variable T, as used herein, describes the type of current response waveform used in the analysis and is a function of a percentage range over which the fall time is calculated and is a function of the type of current response waveform and a percentage range over which the fall time is calculated. If $x_{upper}$ represents the percentage of the upper voltage in the range and $x_{lower}$ represents the percentage of the lower voltage, then τ for the triangular waveform is:

$$\tau_{tri} = T_{transition} \cdot \frac{(x_{upper} - x_{lower})}{\left(2 - \sqrt{2(1 - x_{upper})}\right) - \sqrt{2x_{lower}}}$$

As an example, if the transition time, $T_{transition}$, were calculated over the 30% to 70% range, then for the triangular waveform:

$$\tau_{tri} = T_{transition} \cdot \frac{(.7 - .3)}{\left(2 - \sqrt{2 \cdot (1 - .7)}\right) - \sqrt{2 \cdot .3}}$$

and:

$$\tau_{tri} = \frac{T_{transition}}{1.12702}$$

The variable τ for the exponentially decaying waveform is:

$$\tau_{exp} = T_{transition} \cdot \frac{(x_{upper} - x_{lower})}{(\ln(x_{upper}) - \ln(x_{lower}))}$$

If the transition time, $T_{transition}$, were calculated over the 30% to 70% range, then for the exponentially decaying waveform:

$$\tau_{exp} = T_{transition} \cdot \frac{(.7 - .3)}{(\ln(.7) - \ln(.3))}$$

and:

$$\tau_{exp} = \frac{T_{transition}}{2.11824}$$

Results of the timing simulator calculations are used in the next step of assessing each net for risk of electromigration in which a maximum allowable effective capacitance is calculated for each net using either a maximum peak current density analysis or a root mean square ("RMS") current density analysis. Under most circumstances, the RMS current density analysis reflects the most pessimistic results. If, under the circumstances, a decision is made to ignore for the time being the longevity issues related to electromigration, a designer may choose to perform the peak density analysis to identify those nets with electromigration issues that will prevent power up of the IC. Both current density analyses provide an indication of which nets 401 in the netlist 110 potentially exceed the maximum current density, either peak or RMS, that the wires 403 and the vias 404 can accommodate. If any nets 401 are identified as being at risk 105, an IC designer can review 106 the analysis assumptions to ensure that they are not unreasonably pessimistic. If the analysis assumptions are unreasonably pessimistic, the IC designer has the option of revising the assumptions 107 to use an alternate embodiment of the assessment step 104 and repeating the step of assessing 104 the electromigration risk using new analysis assumptions. For example, if the analysis were performed using RMS current density parameters, an IC designer may choose to analyze the design using peak current density parameters. Alternatively, if the analysis were performed assuming an exponentially decaying current waveform response, an IC designer may choose to analyze the design using a triangular current waveform response. In most cases, it is assumed that there is a single transition of the current response for each positive transition of the clock stimulus. If a current response transitions less frequently than once per clock cycle and the frequency of the current response is less than an inverse of a thermal time constant of the net, then the net itself has more time to dissipate heat and will be less prone to the ill effects of electromigration. If the frequency of the current response is greater than the inverse of the thermal time constant, the metal line will reach a steady state temperature within a few clock cycles. An exception to the later point is nets that have very large currents. With these nets, there is a possibility of a thermal runaway condition, which is beyond the scope of the present disclosure and is unrelated to the electromigration phenomenon. If it is known that one or more nets toggle only every other clock period or every third clock period, then a number of periods of the clock per transition of the current response term ($k_{ppt}$) may be used to take this reality into account. Specifically, $T_{period}$ may be multiplied by the number of cycles of the clock in which a current response transition occurs, so that the $T_{period}$ term becomes $$T_{period} \cdot k_{ppt}$$

As an illustrative example, if the current waveform transitions once for every three complete periods of the clock, the $k_{ppt}$ is 3 and the $T_{period}$ variable is multiplied by a factor of 3 or $3T_{period}$.

If the design assumptions are accurate and are not unreasonably pessimistic, the nets 401 that have been identified as being at risk may be simulated 108 using a tool such as SPICE to confirm or refute 109 that a re-design is warranted. If so, the IC should be re-designed 102 and another electromigration risk assessment made. As one of ordinary skill in the art appreciates, it is possible to dispense with the proposed method of identifying nets at risk of possible electromigration and simulate all of the nets to obtain an accurate representation of the risk of electromigration. Simulation of all nets in an IC design, however, represents a large computation-intensive undertaking making such a simulation unreasonably expensive as compared to the relative moderate computation needs of the present method. Advantageously, a method according to the teachings of the present invention permits targeted simulation of only those nets that present the possibility of failure through electromigration. This targeted simulation reduces the likelihood that an IC designer will spend precious time and resources examining and revising nets that are not at risk. If simulation of the net confirms 115 the likelihood of failure through electromigration, the identified net should be re-designed 102 and re-evaluated to ensure that the re-design efforts corrected the identified problem. If simulation of the net refutes 116 the likelihood of failure due to the effects of electromigration, then re-design is not necessary to correct the identified net. Using a method according to the teachings of the present invention, the IC designer has information permitting intelligent redesign of the IC to identify and correct electromigration risk.

With specific reference to FIG. 2 of the drawings, there is shown a flow chart representing a more detailed description of a first embodiment of the present method to assess electromigration risk 104 using a root mean square (RMS) current analysis. The process accepts 205 parameters $V_{DD}$, $K_{RMS}$, $Y_{RMS}$, $T_{period}$, $T_{transition}$ for the IC design and $C_{eff}$ for each net 401 in the netlist 110. Variables M, N, $k_{ppt}$, and the type of current waveform response, either triangle or exponentially decaying, are accepted 206 to represent the assumptions made about the net being analyzed. In this step, the variable T may be calculated depending upon the type of current waveform response used for the analysis and the range over which the voltage transition is calculated. The step of revising assumptions 107 modifies the variables that are accepted at 206 and therefore may affect the nets that are identified as being at risk under the analysis.

The maximum allowable RMS capacitance ($C_{max\_RMS}$) is then calculated for each net 401. The term $C_{max\_RMS}$ is used to signify the maximum effective capacitance given when using the RMS current analysis. The maximum allowable RMS capacitance ($C_{max\_RMS}$) is limited by either the maximum allowable RMS current flow through the metal wire 403 that comprises each net 401 or the maximum allowable RMS current flow through the one or more parallel vias 404 that comprise part of the net 401, whichever is less. The maximum allowable RMS capacitance ($C_{max\_RMS}$) is calculated using the IC manufacturer's constant, $K_{RMS}$. The $K_{RMS}$ constant defines a maximum allowable current density through a metal line as a function of a thickness, M 405, of the metal line. The maximum allowable current density is a function of the manufacturer's constant $K_{RMS}$ and the width of the metal line (M) 405. The maximum allowable RMS current through a via 404 is similarly defined using a different manufacturer's constant, $Y_{RMS}$. The $Y_{RMS}$ constant defines a maximum allowable RMS current density through a single via. If N is a number of parallel vias 404 on the net 401, then the maximum allowable RMS current through N parallel vias is $Y_{RMS}$ multiplied by N. Vias that are electrically in series with one another are considered a single via for purposes of the method described. The smaller value of the two maximum current calculations is the limit of the RMS current that the net 401 can reliably accommodate. Accordingly, a net 401 with N parallel vias 404 has a maximum allowable RMS current equal to the smaller value of the maximum RMS current through the metal line 403 and the maximum RMS current through the parallel vias 404 or:

$$\text{MIN}[(K_{rms}M), (Y_{rms}N)]$$

For each current waveform response, the RMS current may be calculated as:

$$I_{RMS} = \sqrt{\frac{\int_0^{T_{period}} I^2(t)\,dt}{T_{period}}} \quad (1)$$

Using an equation relating the physical properties of charge to voltage and capacitance, then:

$$I_{peak} = \frac{C_{eff} V_{DD}}{\tau} \quad (2)$$

For an exponentially decaying waveform, the equation for RMS current becomes:

$$I_{RMS} = I_{peak} \cdot \sqrt{\frac{\tau_{exp}}{2T_{period}}\left(1 - e^{\frac{-2T_{period}}{\tau_{exp}}}\right)}$$

Substituting the variable $I_{peak}$, it is possible to solve for the maximum effective capacitance assuming the exponentially decaying waveform current response where:

$$C_{max\_RMS} = \frac{\text{MIN}[(K_{rms}M), (Y_{rms}N)]}{V_{DD}} \cdot \sqrt{\frac{2\tau_{exp} k_{ppi} T_{period}}{\left(1 - e^{\frac{-2k_{ppi} T_{period}}{\tau_{exp}}}\right)}}$$

As one of ordinary skill in the art can appreciate, the maximum allowable effective capacitance based on an RMS current analysis ($C_{max\_RMS}$) as presented herein may be determined for each net 401 based upon manufacturer's constants, physical properties of the net 401, and factors known or calculated from the timing simulator tool using the netlist 110.

The maximum allowable capacitance ($C_{max\_RMS}$) is then compared 203 to the effective capacitance value ($C_{eff}$) calculated for the net 401. The $C_{max\_RMS}$ calculation is performed for each net 401 in the netlist 110 in order to identify 204 those nets at risk of exceeding the RMS current limit. If the effective capacitance ($C_{eff}$) of the net 401 is greater than the maximum allowable capacitance ($C_{max\_RMS}$) calculated for the net 401 then the net 401 is identified as being possibly at risk of failure due to effects of electromigration. Because $C_{max\_RMS}$ is based upon RMS current flow, exceeding it could cause catastrophic failure from electromigration over time.

Before redesign of the identified net, however, an IC designer can review the design assumptions that are a function of the calculated value to ensure that they are not unreasonably pessimistic. If the assumptions are unreasonably pessimistic, the IC designer has the option of revising the assumptions 107 and repeating the steps to check each net for risk of electromigration. Specifically, the IC designer can confirm that the width of the metal line, M 405, and the number of parallel vias 404, N, in the net 401 conform to the values used to calculate the maximum allowable capacitance ($C_{max\_RMS}$). If the metal line width, M 405, and number of parallel vias 404, N, are accurate or are reasonable assumptions, then an IC designer can determine if the assumption of a single transition per period is reasonable and adjust the variable, $k_{ppi}$, accordingly.

An IC designer or design team may also determine if the exponentially decaying current waveform response 801 is a reasonable assumption. If the exponentially decaying current waveform response 801 is overly pessimistic, an IC designer may choose to perform the calculations using an alternate embodiment and assume a triangular current waveform response 701. If the exponentially decaying waveform current response 801 is reasonable, then the nets 401 identified as risks for electromigration may be simulated 108 using a tool such as SPICE to confirm or refute the electromigration risk. If the risk is real, the IC should be re-designed. If the exponentially decaying waveform current response 801 is not reasonable, the IC designer can choose to base the maximum allowable capacitance value ($C_{max\_RMS}$) on the triangle waveform current response 701.

In an alternate embodiment, it may be assumed that the current response to the voltage stimulus takes the form of the triangular waveform current response 701. The transition time ($T_{transition}$), clock period ($T_{period}$) and the process voltage ($V_{DD}$) are all known from the IC design information and the calculation step 103. Just as in the exponentially decaying waveform calculations, the maximum allowable RMS flow capacitance ($C_{max\_RMS}$) value is similarly limited by either the maximum allowable RMS current flow through the metal line 403 or the maximum allowable RMS current flow through the vias 404 on the net 401, whichever is less.

Given the RMS current equation (1), the RMS current assuming a triangular current waveform response is:

$$I_{RMS} = I_{peak} \cdot \sqrt{\frac{2 \cdot \tau_{tri}}{3 \cdot T_{period}}}$$

Substituting equation (2) for $I_{peak}$, the equation for maximum allowable capacitance assuming a triangular waveform current response is:

$$C_{max\_RMS} = \frac{\text{MIN}[(K_{rms}M),(Y_{rms}N)]}{V_{DD}} \cdot \sqrt{\frac{3\tau_{tri}k_{ppi}T_{period}}{2}}$$

The maximum allowable capacitance using RMS current analysis ($C_{max\_RMS}$) as recalculated assuming the triangular waveform response is then compared 203 to the value found for the effective capacitance ($C_{eff}$) for each net 401 in the netlist 110 to identify those nets at risk of potential electromigration. If the effective capacitance ($C_{eff}$) is greater than the maximum allowable effective capacitance ($C_{max\_RMS}$) the net is identified 204 as being at risk of electromigration.

In another alternate embodiment according to the teachings of the present invention and with specific reference to FIG. 3 of the drawings, there is shown a flow chart for a method for analyzing nets at risk of failure due to effects of electromigration using a peak current analysis. Two manufacturer's constants that are different from the constants used in the RMS current analysis are used for the peak current analysis and are accepted 305 by the process that identifies nets as being at risk using the peak current analysis. Assumptions made as part of the analysis are contained with the variables $\tau$, $k_{ppt}$, M, and N and are also accepted 306 at the start of the peak current analysis embodiment of process 104. As with the RMS current analysis, the step of modifying assumptions 107 will alter one or more of the variables that are accepted in step 306, thereby changing those nets that are identified as being at risk of failure due to electromigration effects. The manufacturer's constants are $K_{peak}$ which represents maximum peak current through a metal line of unit width and $Y_{peak}$ which represents maximum peak current through a via. The peak current analysis is similar to the RMS current analysis except that a maximum allowable effective capacitance based on a peak analysis, $C_{max\_RMS}$, is calculated using the following equation assuming the decaying exponential waveform current response 801:

$$C_{max\_peak} = \frac{\text{MIN}[(K_{peak}M),(Y_{peak}N)]}{V_{DD}} \cdot \sqrt{\tau_{exp}k_{ppi}T_{period}}$$

The term $C_{max\_RMS}$ is used to signify the maximum effective capacitance when using the peak current analysis. If any of the nets 401 have an effective capacitance larger than the maximum allowable effective capacitance calculated using the equation above, then the net 401 is identified 304 as being at risk of possible failure due to electromigration effects over time. As with the RMS current analysis, an IC designer may then modify 107 any assumptions for the identified nets that are not reasonable under the circumstances. Specifically, the assumptions as to metal line width, M 405, the number of parallel vias 404, designated as N, on the identified nets 401 may be modified as well as the number of clock periods per transition, $k_{ppt}$. In addition, the IC designer may decide that the decaying exponential current waveform response 801 is overly pessimistic and calculations based upon the triangular current waveform response 701 may be used. If any of the assumptions are modified 107, the maximum allowable peak capacitance. $C_{max\_RMS}$, value is re-calculated 302 and compared 303 against the value for the effective capacitance of each net 401.

If the decaying exponential waveform current response 801 is unreasonably pessimistic, the IC designer can modify the assumption that the current response to the voltage step 501 is triangular in nature 701. In another alternate embodiment according to the teachings of the present invention, the maximum allowable effective capacitance, $C_{max\_RMS}$, based upon a peak current analysis for the triangular waveform current response 701 is calculated 302 as:

$$C_{max\_peak} = \frac{\text{MIN}[(K_{peak}M),(Y_{peak}N)]}{V_{DD}} \cdot \sqrt{\tau_{tri}k_{ppi}T_{period}}$$

The effective capacitance for each net is again compared 303 against the maximum allowable effective capacitance for each net 401 based on maximum peak current. Those nets 401 where the effective capacitance exceeds the maximum allowable capacitance for each net 401 are identified 304 as possibly at risk of failure due to electromigration effects.

The decision as to which embodiment to use for electromigration risk assessment is based upon professional judgment of the IC designer or design team as to which analysis most accurately reflects the behavior of the design. In a specific embodiment, the RMS current analysis is performed first simply because it is the most cautious approach because it reflects the most pessimistic results. That is to say, in a specific embodiment, if a net can pass the RMS analysis without being identified as an at risk net, it will also pass the peak analysis. In such an embodiment, it is beneficial to use the RMS and peak analysis methods in combination to a design advantage. Specifically, as a design approaches a deadline and if there are a large number of nets identified as being at risk of failure due to the effects of electromigration as identified using the RMS current analysis, other tasks may take precedence over fixing all nets identified. If the IC design will have further revisions, an IC designer may elect to identify and correct only those nets identified using the peak current analysis. Correction of the remaining nets identified using an RMS analysis and not identified using a peak analysis may be delayed until a future design revision and prior to production of the device. Advantageously, the design may be made and tested to ensure functionality earlier and longevity issues may be addressed in parallel with the initial testing process. In an alternative embodiment, the peak analysis method is the more pessimistic that the RMS analysis. In such a case, an IC designer may use the peak analysis exclusively. With respect to the decision to use the decaying exponential current response waveform or the triangular current response waveform, the decision is based primarily on the IC designer's judgment. The exponentially decaying waveform provides the most cautious and pessimistic results. In cases where the triangular waveform more closely approximates the actual behavior of the IC design, however, the triangular waveform analysis may be preferred.

Embodiments that have been described herein are intended to be illustrative and not exhaustive of the possible embodiments based upon the teachings of the present invention. Accordingly, the scope of the invention shall be limited only by the appended claims.

What is claimed is:

1. A method of identifying one or more nets in a digital IC design that are at risk of electromigration comprising the steps of:

selecting a manufacturing process for said digital IC design, obtaining a clock period and process voltage for said digital IC design, obtaining a voltage waveform transition time for one or more nets of said digital IC design, calculating a maximum effective capacitance for each one of said one or more nets as a function of a maximum allowable current density through a wire that comprises said net, a maximum allowable current density through a via that comprises said net, a minimum width of said wire, and minimum number of parallel vias per net, calculating an effective capacitance for each one of said one or more nets, and comparing said maximum allowable effective capacitance against each said effective capacitance.

2. A method as recited in claim 1 wherein said maximum effective capacitance is a function of maximum allowable peak current density.

3. A method as recited in claim 2 wherein said maximum effective capacitance is based upon a decaying exponential waveform current response.

4. A method as recited in claim 3 wherein said maximum allowable capacitance $C_{max\_peak}$ is calculated using the equation:

$$C_{max\_peak} = \frac{\text{MIN}[(K_{peak}M), (Y_{peak}N)]}{V_{DD}} \cdot \sqrt{\tau_{exp} k_{ppi} T_{period}}$$

where $K_{peak}$ and $Y_{peak}$ represent maximum peak current density through a wire and maximum peak current density through a via, respectively, $V_{DD}$ is said process voltage, $T_{period}$ is said clock period, $k_{ppt}$ is a number of periods of a clock per transition of said current response, $\tau_{exp}$ is a function of said transition time $T_{transition}$ where $$\tau_{exp} = T_{transition} \cdot \frac{(x_{upper} - x_{lower})}{(\ln(x_{upper}) - \ln(x_{lower}))}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

5. A method as recited in claim 2 wherein said maximum effective capacitance is based upon a triangular waveform current response.

6. A method as recited in claim 5 wherein said maximum allowable capacitance $C_{max\_peak}$ is calculated using the equation:

$$C_{max\_peak} = \frac{\text{MIN}[(K_{peak}M), (Y_{peak}N)]}{V_{DD}} \cdot \sqrt{\tau_{tri} k_{ppi} T_{period}}$$

where $K_{peak}$ and $Y_{peak}$ represent maximum peak current density through a wire and maximum peak current density through a via, respectively, $V_{DD}$ is said process voltage, $T_{period}$ is said clock period, $k_{ppt}$ is a number of clock periods per transition of said current response, $\tau_{tri}$ is a function of said transition time $T_{transition}$ where $$\tau_{tri} = T_{transition} \cdot \frac{(x_{upper} - x_{lower})}{\left(2 - \sqrt{2(1 - x_{upper})} - \sqrt{2x_{lower}}\right)}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

7. A method as recited in claim 1 wherein said maximum effective capacitance is a function of maximum allowable root mean square current density.

8. A method as recited in claim 7 wherein said maximum effective capacitance is based upon a decaying exponential waveform current response.

9. A method as recited in claim 8 wherein said maximum allowable effective capacitance $C_{max\_RMS}$ is calculated using the equation $$C_{max\_RMS} = \frac{\text{MIN}[K_{rms}M, Y_{rms}N]}{V_{DD}} \sqrt{\frac{2\tau_{exp} k_{ppt} T_{period}}{\left(1 - e^{\frac{-2k_{ppi} T_{period}}{\tau_{exp}}}\right)}}$$

where $K_{RMS}$ and $Y_{RMS}$ represent maximum current density through said wire and maximum current density through said via, respectively, $V_{DD}$ is said process voltage, $T_{period}$ is said clock period, $k_{ppt}$ is a number of clock periods for each transition of said waveform current response, $\tau_{exp}$ is a function of said transition time $T_{transition}$ where $$\tau_{exp} = T_{transition} \cdot \frac{(x_{upper} - x_{lower})}{(\ln(x_{upper}) - \ln(x_{lower}))}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

10. A method as recited in claim 7 wherein said maximum effective capacitance is based upon a triangular waveform current response.

11. A method as recited in claim 10 wherein said maximum allowable effective capacitance $C_{max\_rms}$ is calculated using the equation:

$$C_{max\_rms} \frac{\text{MIN}[(K_{rms}M), (Y_{rms}N)]}{V_{DD}} \cdot \sqrt{\frac{3\tau_{tri} k_{ppi} T_{period}}{2}}$$

where $K_{RMS}$ and $Y_{RMS}$ represent maximum current density through a wire and maximum current density through a via, respectively, $V_{DD}$ is said process voltage, $T_{period}$ is said clock period, $k_{ppt}$ is a number of clock periods per transition of said current response, $\tau_{tri}$ is a function of said transition time $T_{transition}$ where $$\tau_{tri} = T_{transition} \cdot \frac{(x_{upper} - x_{lower})}{\left(2 - \sqrt{2(1 - x_{upper})} - \sqrt{2x_{lower}}\right)}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

12. A method as recited in claim 1 and further comprising the steps of:
- evaluating parameters used in said step of calculating said maximum effective capacitance,
- modifying said parameters to more closely represent said digital IC design, and
- repeating said steps of calculating said maximum effective capacitance and comparing said maximum effective capacitance against each said effective capacitance until said maximum effective capacitance is greater than or equal to said effective capacitance for each said net.

13. A method as recited in claim 1 wherein said maximum allowable effective capacitance is a function of a clock period, said voltage waveform transition time, a minimum width of said wire, and a quantity of parallel vias on said net.

14. A system for identifying one or more nets in a digital IC design that are at risk of electromigration comprising:
- a processing element having memory and operatively communicating with a display device, and having an operating system for performing commands dictated by a program, said program comprising:
  - means for obtaining a clock period and process voltage for said digital IC design,
  - means for obtaining a voltage waveform transition time for one or more nets of said digital IC design,
  - means for calculating a maximum effective capacitance for each one of said one or more nets as a function of a maximum allowable current density through a wire that comprises said net, a maximum allowable current density through a via that comprises said net, a minimum width of said wire, and minimum number of parallel vias per net,
  - means for calculating an effective capacitance for each one of said one or more nets and
  - means for comparing said maximum allowable effective capacitance against each said effective capacitance.

15. A system as recited in claim 14 wherein said maximum effective capacitance is a function of maximum allowable peak current density.

16. A system as recited in claim 15 wherein said maximum effective capacitance is based upon a decaying exponential waveform current response.

17. A system as recited in claim 16 wherein said maximum allowable capacitance $C_{max\_peak}$ is calculated using the equation:

$$C_{max\_peak} = \frac{\text{MIN}\lfloor (K_{peak} M), (Y_{peak} N) \rfloor}{V_{DD}} \cdot \sqrt{\tau_{exp} k_{ppt} T_{period}}$$

where $K_{peak}$ and $Y_{peak}$ represent maximum peak current density through a wire and maximum peak current density through a via, respectively, $V_{DD}$ is said process voltage, $T_{period}$ is said clock period, $k_{ppt}$ is a number of clock periods for each transition of said waveform current response, $\tau_{exp}$ is a function of said transition time $T_{transition}$ where $$\tau_{exp} = T_{transition} \cdot \frac{(x_{upper} - x_{lower})}{(\ln(x_{upper}) - \ln(x_{lower}))}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

18. A system as recited in claim 15 wherein said maximum effective capacitance is based upon a triangular waveform current response.

19. A system as recited in claim 18 wherein said maximum allowable capacitance $C_{max\_peak}$ is calculated using the equation:

$$C_{max\_peak} = \frac{\text{MIN}\lfloor (K_{peak} M), (Y_{peak} N) \rfloor}{V_{DD}} \cdot \sqrt{\tau_{tri} k_{ppt} T_{period}}$$

where $K_{peak}$ and $Y_{peak}$ represent maximum peak current density through a wire and maximum peak current density through a via, respectively, $V_{DD}$ is said process voltage, $T_{period}$ is said clock period, $k_{ppt}$ is a number of clock periods for each transition of said waveform current response, $\tau_{tri}$ is a function of said transition time $T_{transition}$ where $$\tau_{tri} = T_{transition} \cdot \frac{(x_{upper} - x_{lower})}{\left(2 - \sqrt{2(1 - x_{upper})} - \sqrt{2x_{lower}}\right)}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

20. A system as recited in claim 14 wherein said maximum effective capacitance is a function of maximum allowable root mean square current density.

21. A system as recited in claim 20 wherein said maximum effective capacitance is based upon a decaying exponential waveform current response.

22. A system as recited in claim 21 wherein said maximum allowable effective capacitance $C_{max\_rms}$ is calculated using the equation $$C_{max\_rms} = \frac{\text{MIN}[K_{rms} M, Y_{rms} N]}{V_{DD}} \sqrt{\frac{2\tau_{exp} k_{ppt} T_{period}}{\left(1 - e^{\frac{-2k_{ppt} T_{period}}{\tau_{exp}}}\right)}}$$

where $K_{RMS}$ and $Y_{RMS}$ represent maximum current density through a wire and maximum current density through a via, respectively, $V_{DD}$ is said process voltage, $T_{period}$ is said clock period, $k_{ppt}$ is a number of clock periods for each transition of said waveform current response, $\tau_{exp}$ is a function of said transition time $T_{transition}$ where $$\tau_{exp} = T_{transition} \cdot \frac{(x_{upper} - x_{lower})}{(\ln(x_{upper}) - \ln(x_{lower}))}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

23. A system as recited in claim 20 wherein said maximum effective capacitance is based upon a triangular waveform current response.

24. A system as recited in claim 23 wherein said maximum allowable effective capacitance $C_{max\_rms}$ is calculated using the equation:

$$C_{\text{max\_rms}} = \frac{\text{MIN}[(K_{rms} M), (Y_{rms} N)]}{V_{DD}} \cdot \sqrt{\frac{3\tau_{tri} k_{ppt} T_{period}}{2}}$$

where $K_{RMS}$ and $Y_{RMS}$ represent maximum current density through a wire and maximum current density through a via, respectively, $V_{DD}$ is said process voltage, $T_{period}$ is said clock period, $k_{ppt}$ is a number of clock periods for each transition of said waveform current response, $\tau_{tri}$ is a function of said transition time $T_{transition}$ where $$\tau_{tri} = T_{transition} \cdot \frac{(x_{upper} - x_{lower})}{\left(2 - \sqrt{2(1-x_{upper})} - \sqrt{2x_{lower}}\right)}$$

where $x_{upper}$ is a ratio of an upper voltage to peak voltage from which said transition time is calculated and $x_{lower}$ is a ratio of a lower voltage to peak voltage from which said transition time is calculated, M is said minimum width, and N is said quantity of parallel vias.

25. A system as recited in claim 14 and further comprising the means of:
evaluating parameters used in said means of calculating said maximum effective capacitance,
modifying said parameters to more closely represent said digital IC design, and
repeating said means of calculating said maximum effective capacitance and comparing said maximum effective capacitance against each said effective capacitance until said maximum effective capacitance is greater than or equal to said effective capacitance for each said net.

26. A system as recited in claim 14 wherein said maximum allowable effective capacitance is a function of a clock period, said voltage waveform transition time, a minimum width of said wire, and a quantity of parallel vias on said net.

* * * * *